(12) United States Patent
Guo

(10) Patent No.: US 11,257,862 B2
(45) Date of Patent: Feb. 22, 2022

(54) MRAM HAVING SPIN HALL EFFECT WRITING AND METHOD OF MAKING THE SAME

(71) Applicant: Yimin Guo, San Jose, CA (US)

(72) Inventor: Yimin Guo, San Jose, CA (US)

(*) Notice: Subject to any disclaimer, the term of this patent is extended or adjusted under 35 U.S.C. 154(b) by 0 days.

(21) Appl. No.: 14/611,083

(22) Filed: Jan. 30, 2015

(65) Prior Publication Data
US 2016/0225982 A1 Aug. 4, 2016

(51) Int. Cl.
*H01L 43/14* (2006.01)
*H01L 27/22* (2006.01)
*H01L 43/06* (2006.01)
*H01L 43/04* (2006.01)
*H01L 43/08* (2006.01)
*H01L 43/12* (2006.01)

(52) U.S. Cl.
CPC ............ *H01L 27/228* (2013.01); *H01L 43/08* (2013.01); *H01L 43/12* (2013.01)

(58) Field of Classification Search
None
See application file for complete search history.

(56) References Cited

U.S. PATENT DOCUMENTS

| | | | |
|---|---|---|---|
| 10,608,170 B2 * | 3/2020 | Guo .................. | H01L 43/12 |
| 2007/0251456 A1 * | 11/2007 | Herchen ............ | H01L 21/67109 118/724 |
| 2009/0244785 A1 * | 10/2009 | Kikuchi ............. | B82Y 10/00 360/294 |
| 2011/0121417 A1 * | 5/2011 | Li ...................... | H01L 43/12 257/421 |
| 2014/0056060 A1 * | 2/2014 | Khvalkovskiy ..... | H01L 27/228 365/158 |

* cited by examiner

*Primary Examiner* — Mounir S Amer

(57) ABSTRACT

A spin-transfer-torque magnetoresistive memory comprises apparatus and method of manufacturing a three terminal magnetoresistive memory element having highly conductive bottom electrodes overlaid on top of a SHE-metal layer in the regions outside of an MTJ stack. The memory cell comprises a bit line positioned adjacent to selected ones of the plurality of magnetoresistive memory elements to supply a reading current across the magnetoresistive element stack and two highly conductive bottom electrodes overlaid and electrically contacting on top of a SHE-metal layer in the outside of an MTJ region and to supply a bi-directional spin Hall effect recording current, and accordingly to switch the magnetization of the recording layer. Thus magnetization of a recording layer can be readily switched or reversed to the direction in accordance with a direction of a current along the SHE-metal layer by applying a low write current.

5 Claims, 5 Drawing Sheets

MRAM HAVING SPIN HALL EFFECT WRITING AND METHOD OF MAKING THE SAME

RELATED APPLICATIONS

This application is a divisional application due to a restriction requirement on application Ser. No. 14/198,589. This application seeks priority to U.S. Utility patent application Ser. No. 14/198,589 filed on Mar. 6, 2014 and U.S. Provisional Patent Application No. 61/774,578 filed on Mar. 8, 2013; the entire contents of each of which are incorporated herein by reference.

BACKGROUND OF THE INVENTION

1. Field of the Invention

This invention relates generally to a three-terminal spin-transfer-torque magnetic-random-access memory (MRAM) element having spin hall effect writing and a method of manufacturing the same magnetoresistive element.

2. Description of the Related Art

In recent years, magnetic random access memories (hereinafter referred to as MRAMs) using the magnetoresistive effect of magnetic tunnel junction(s) (MTJ(s)) have been drawing increasing attention as the next-generation solid-state nonvolatile memories that can also cope with high-speed reading and writing. A ferromagnetic tunnel junction has a three-layer stack structure formed by stacking a recording layer having a changeable magnetization direction, an insulating tunnel barrier layer, and a fixed layer that is located on the opposite side from the recording layer and maintains a predetermined magnetization direction. Corresponding to the parallel and anti-parallel magnetic states between the recording layer magnetization and the reference layer magnetization, the magnetic memory element has low and high electrical resistance states, respectively. Accordingly, a detection of the resistance allows a magnetoresistive element to provide information stored in the magnetic memory device.

Typically, MRAM devices are classified by different write methods. A traditional MRAM is a magnetic field-switched MRAM utilizing electric line currents to generate magnetic fields and switch the magnetization direction of the recording layer in a magnetoresistive element at their cross-point location during the programming write. A spin-transfer torque (or STT)-MRAM has a different write method utilizing electrons' spin momentum transfer. Specifically, the angular momentum of the spin-polarized electrons is transmitted to the electrons in the magnetic material serving as the magnetic recording layer. According to this method, the magnetization direction of a recording layer is reversed by applying a spin-polarized current to the magnetoresistive element. As the volume of the magnetic layer forming the recording layer is smaller, the injected spin-polarized current to write or switch can be also smaller.

To record information or change resistance state, typically a recording current is provided by its CMOS transistor to flow in the stacked direction of the magnetoresistive element, which is hereinafter referred to as a "vertical spin-transfer method." Generally, constant-voltage recording is performed when recording is performed in a memory device accompanied by a resistance change. In a STT-MRAM, the majority of the applied voltage is acting on a thin oxide layer (tunnel barrier layer) which is about 10 angstroms thick, and, if an excessive voltage is applied, the tunnel barrier breaks down. More, even when the tunnel barrier does not immediately break down, if recording operations are repeated, the element may still become nonfunctional such that the resistance value changes (decreases) and information readout errors increase, making the element un-recordable. Furthermore, recording is not performed unless a sufficient voltage or sufficient spin current is applied. Accordingly, problems with insufficient recording arise before possible tunnel barrier breaks down.

Reading STT MRAM involves applying a voltage to the MTJ stack to discover whether the MTJ element states at high resistance or low. However, a relatively high voltage needs to be applied to the MTJ to correctly determine whether its resistance is high or low, and the current passed at this voltage leaves little difference between the read-voltage and the write-voltage. Any fluctuation in the electrical characteristics of individual MTJs at advanced technology nodes could cause what was intended as a read-current, to have the effect of a write-current, thus reversing the direction of magnetization of the recording layer in MTJ.

It has been known that a spin current can, alternatively, be generated in non-magnetic transition metal material by a so-called Spin Hall Effect (SHE), in which spin-orbit coupling causes electrons with different spins to deflect in different directions yielding a pure spin current transverse to an applied charge current. Recently discovered Giant Spin Hall Effect (GSHE), the generation of large spin currents transverse to the charge current direction in specific high-Z metals (such as Pt, $\beta$-Ta, $\beta$-W, doped Cu) is a promising solution to the voltage, current scaling and reliability problems in a spin torque transfer MRAM.

Due to the relatively low resistivity of GSHE-metals compared to MTJs, the write voltages compatible with future CMOS technology nodes can be expected while the required current density is reduced. However, the spin hall injection efficiency, or ratio of spin current injected to the charge current in the electrode, as a function of electrode thickness has an optimum value at 2-3 nm electrode thickness. Since the thin GSHE-metal layer in outside regions is connected with MTJs in series as electrodes having a large resistance, the effective magnetoresistive ratio is reduced and degrades output signal and reading performance.

Thus, it is desirable to provide a SHE STT-MRAM structure and method of making the same that the geometry is easy to fabricate and has comparable efficiency to conventional two-terminal MTJs while providing greatly improved reliability while keeping high read output signal levels, and therefore offers a superior approach for magnetic memory and non-volatile spin logic applications.

BRIEF SUMMARY OF THE PRESENT INVENTION

The present invention comprises a three terminal magnetoresistive element having a giant-SHE metal immediately adjacent to a recording layer of an MTJ junction stack to produce current-induced switching of in-plane magnetic recording layer magnetization, with read-out using a magnetic tunnel junction with a large magnetoresistance. The magnetoresistive element in the invention has three terminals: an upper electrode connected to a bit line, an MTJ stack is sandwiched between an upper electrode and a giant-SHE layer which is immediately underneath a recording layer and connects to a first bottom electrode and a second electrode in the regions outside of the MTJ stack, both the first bottom electrode and the second bottom electrode are highly conductive and further connected to a write circuitry which supplies a write current along the giant-SHE layer and bi-directionally supplies a spin Hall current induced torque on the recording layer magnetization of the MTJ stack, and at least one bottom electrode connected to a read circuitry which supplies a read current flowing across the MTJ stack for read operation.

An exemplary embodiment includes a structure of a three terminal SHE spin-transfer-torque magnetoresistive memory including a bit line positioned adjacent to selected ones of the plurality of magnetoresistive memory elements to supply a reading current across the magnetoresistive element stack and two highly conductive bottom electrodes overlaid and electrically contacting on top of a SHE-metal layer in the outside of an MTJ region and to supply a bi-directional spin Hall effect recording current, and accordingly to switch the magnetization of the recording layer. Thus magnetization of a recording layer can be readily switched or reversed to the direction in accordance with a direction of a current along the SHE-metal layer by applying a low write current.

The present invention further comprises a method of manufacturing a three terminal magnetoresistive memory element having highly conductive bottom electrodes overlaid on top of a SHE-metal layer in the regions outside of an MTJ stack.

The drawings are schematic or conceptual, and the relationships between the thickness and width of portions, the proportional coefficients of sizes among portions, etc., are not necessarily the same as the actual values thereof.

DETAILED DESCRIPTION OF THE INVENTION

Figure 1:
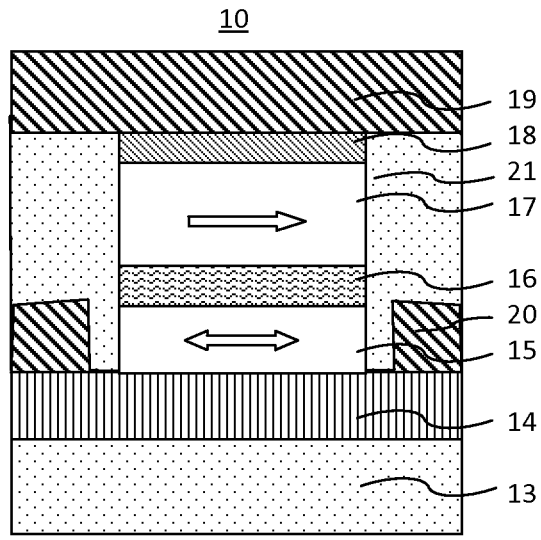
FIG. 1 is a cross-section of one memory cell in a three terminal SHE MRAM array having highly conductive electrodes

In general, according to each embodiment, there is provided a three terminal magnetoresistive memory cell comprising:

a SHE metal layer provided on a surface of a substrate;

a recording layer provided on the top surface of the SHE layer having magnetic anisotropy in a film plane and having a variable magnetization direction;

a tunnel barrier layer provided on the top surface of the recording layer;

a reference layer provided on the top surface of the tunnel barrier layer having magnetic anisotropy in a film plane and having an invariable magnetization direction;

a cap layer provided on the top surface of the reference layer as an upper electric electrode;

a first bottom electrode provided on a first side of the SHE metal layer and electrically connected to the SHE metal layer;

a second bottom electrode provided on a second side of the SHE metal layer and electrically connected to the SHE metal layer;

a bit line provided on the top surface of the cap layer;

two CMOS transistors coupled the plurality of magnetoresistive memory elements through the two bottom electrodes.

There is further provided circuitry connected to the bit line, and two select transistors of each magnetoresistive memory cell.

Spin Hall effect consists of the appearance of spin accumulation on the lateral surfaces of an electric current-carrying sample, the signs of the spin directions being opposite on the opposing boundaries. When the current direction is reversed, the directions of spin orientation are also reversed. The origin of SHE is in the spin-orbit interaction, which leads to the coupling of spin and charge currents: an electrical current induces a transverse spin current (a flow of spins) and vice versa. In a giant spin Hall effect (GSHE), very large spin currents transverse to the charge current direction in specific high-Z metal (such as Pt, β-Ta, β-W, doped Cu) layer underneath a recording layer may switch the magnetization directions. A polarization ratio in the spin current depends on not only material but also its thickness. Typically, the spin current polarization ratio reached the maximum at a thickness of ~2 nm. A thin SHE layer made of beta-phase tungsten provides a higher spin polarization ratio and a higher resistivity than Ta or Pt SHE layer.

An exemplary embodiment includes a structure of a three terminal SHE spin-transfer-torque magnetoresistive memory including a bit line positioned adjacent to selected ones of the plurality of magnetoresistive memory elements to supply a reading current across the magnetoresistive element stack and two highly conductive bottom electrodes overlaid and electrically contacting on top of a SHE-metal layer in the outside of an MTJ region and to supply a bi-directional spin Hall effect recording current, and accordingly to switch the magnetization of the recording layer. Thus magnetization of a recording layer can be readily switched or reversed to the direction in accordance with a direction of a current along the SHE-metal layer by applying a low write current.

The present invention further comprises a method of manufacturing a three terminal magnetoresistive memory element having highly conductive bottom electrodes overlaid on top of a SHE-metal layer in the regions outside of an MTJ stack. This is achieved by a process flow consisting of dual photo-lithography patterning, etch, refill and CMP processes.

The following detailed descriptions are merely illustrative in nature and are not intended to limit the embodiments of the subject matter or the application and uses of such embodiments. Any implementation described herein as exemplary is not necessarily to be construed as preferred or advantageous over other implementations. Furthermore, there is no intention to be bound by any expressed or implied theory presented in the preceding technical field, background, brief summary, or the following detailed description.

FIG. 1 is a cross-sectional view of a three terminal magnetoresistive memory cell 10 in a STT-MRAM array having a SHE induced spin transfer switching. The magnetoresistive memory cell 10 is configured by a bit line 19, a cap layer 18, a reference layer 17, a tunnel barrier 16, a recording layer 15, a SHE metal layer 14, a dielectric substrate 13, a bottom electrode 20 and a dielectric layer 21. The recording layer has a uniaxial anisotropy and variable magnetization in a film plane. The reference layer has a fixed magnetization in a film plane. The reference layer can be a synthetic anti-ferromagnetic structure having a nonmagnetic metal layer sandwiched by two ferromagnetic layers which have an anti-parallel coupling. Further, an anti-ferromagnetic (AFM) pinning layer can be added on top of the reference layer to fix the reference layer magnetization direction.

Figure 2A:
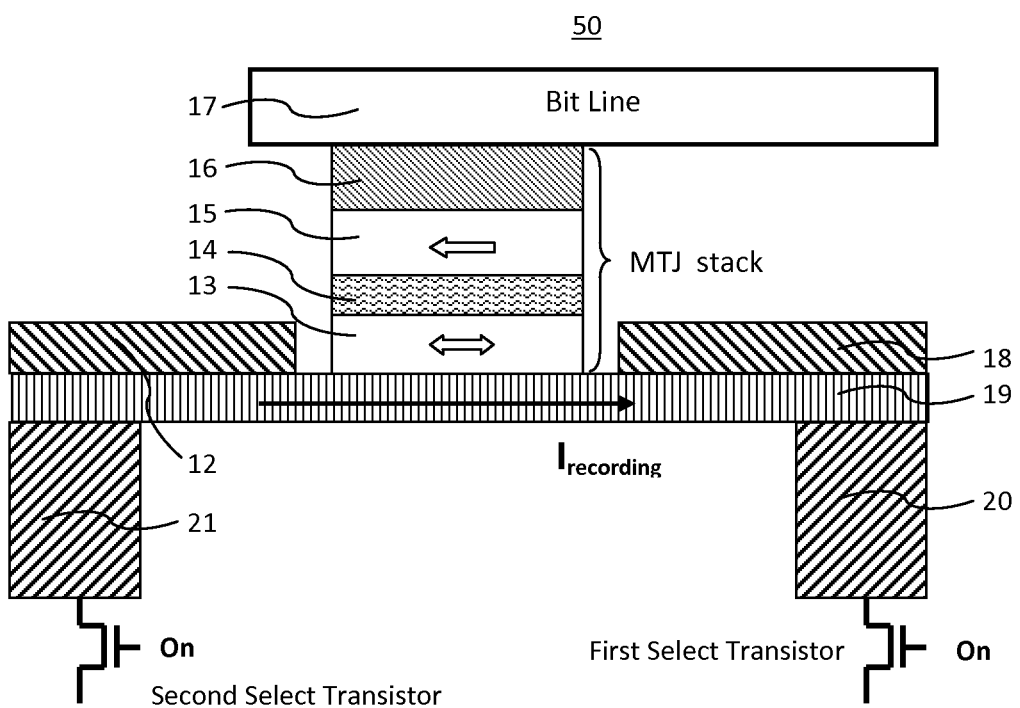
FIG. 2A is a cross-section of one memory cell in a three terminal SHE MRAM array having a spin Hall effect recording current to reverse the recording layer magnetization to the direction in accordance with a direction of a current along the SHE-metal.
Figure 2B:
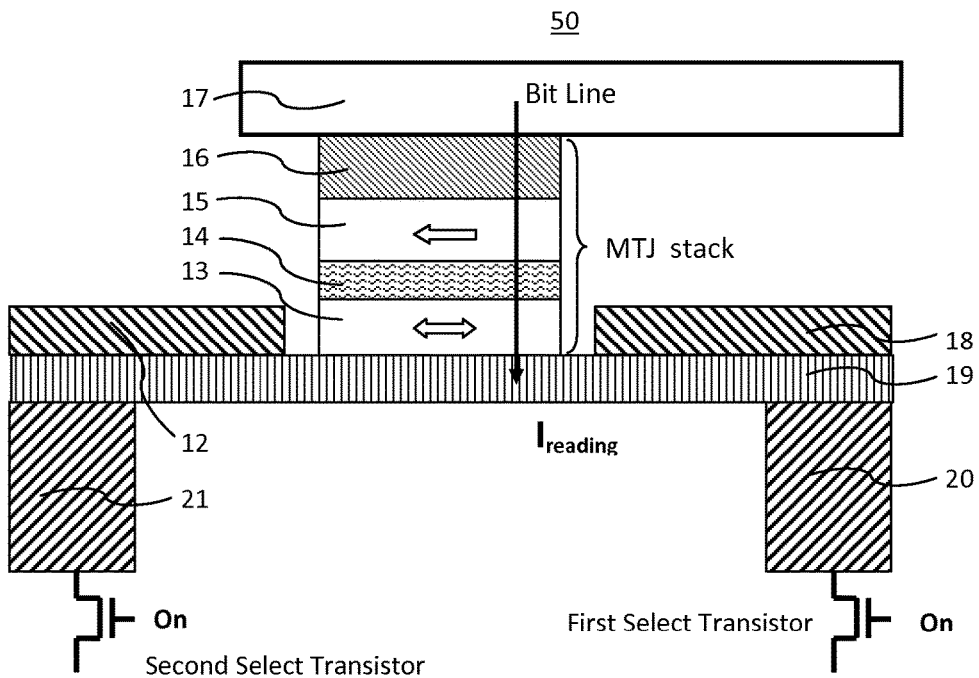
FIG. 2B is a cross-section of one memory cell in a three terminal SHE MRAM array having a reading current flowing across the MTJ stack from the bit line to the bottom SHE-metal.

FIGS. 2A and 2B show magnetoresistive element 50 illustrating the methods of operating a spin-transfer-torque magnetoresistive memory: a SHE spin transfer current driven recording and a MTJ reading, respectively. A circuitry, which is not shown here, is coupled to two select transistors for providing a bi-directional current in the SHE metal layer between a first bottom electrode and a second electrode and is coupled to the bit line for providing a reading current across the MTJ stack between the bit line and the bottom electrodes connecting to the select transistors. The magnetoresistive element 50 comprises: a bit line 17, an MTJ stack comprising a cap layer 16, a reference layer 15, a tunnel barrier 14 and a recording layer 13, a SHE metal layer 19, a first bottom electrode 18, a first VIA 20 of a first select transistor, a second bottom electrode 12, a second VIA 21 of a second select transistor. The SHE metal layer is made by a high-Z metal, such as Pt, β-Ta, β-W, doped Cu, having a thickness in a range between 1.5 nm and 6 nm.

During fabrication of the MRAM array architecture, each succeeding layer is deposited or otherwise formed in sequence and each magnetoresistive element may be defined by selective deposition, photolithography processing, etching, CMP, etc. using any of the techniques known in the semiconductor industry. Typically the layers of the MTJ stack are formed by thin-film deposition techniques such as physical vapor deposition, including magnetron sputtering and ion beam deposition, or thermal evaporation. In addition, the MTJ stack is typically annealed at elevated temperature to achieve a high magnetoresistive ratio and a desired crystal structure and interface.

Referring now to FIGS. 3 through 12, a method of manufacturing a magnetoresistive element in a three terminal SHE spin transfer MRAM array according to the embodiment is described. The magnetoresistive element to be manufactured by the manufacturing method according to this embodiment is the magnetoresistive element 10 of FIG. 1.

Figure 3:
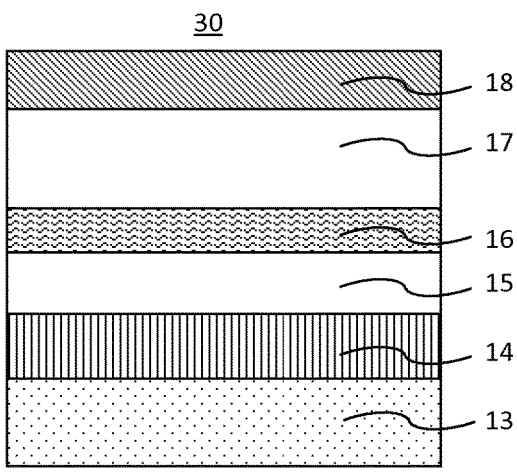
FIG. 3 is a cross-sectional view illustrating a manufacturing method according to the embodiment.

First, as shown in FIG. 3, a magnetoresistive element includes a SHE metal layer 14, a recording layer 15, a tunnel barrier layer 16, a reference layer or reference multilayered stack 17, and a cap layer 18 as a hard mask layer, which are sequentially formed on the substrate 13 by sputtering techniques.

An example of the material of a recording layer is made of a ferromagnetic material alloy containing at least one element selected from Fe, Co and Ni. A recording layer can also be a multilayer such as M1/X/M2 or M1/X/M2/Y/M3, M(1,2,3) are ferromagnetic sub-layers, and X and Y are insertion sub-layers selected from Ta, Ti, Hf, Nb, V, W, Mo, Zr, Ir, Si, Ru, Al, Cu, Ag, Au, etc., or their oxide, nitride, oxynitride layer, for example. An example of a reference multi-layered stack is made of PtMn(30 nm)/CoFe(2 nm)/Ru(0.75 nm)/CoFe(2 nm).

An MTJ stack patterning is then performed by using a known dual-photo lithography patterning technique. This dual-photo lithography patterning process flow consists of a first photo-lithography patterning process, in which the MTJ stack is patterned into a longitudinal shape having a designed width and a much longer length than designed value along a first direction, and a second photo-lithography patterning process in which the MTJ stack is patterned to have final dimensions.

Figure 4:
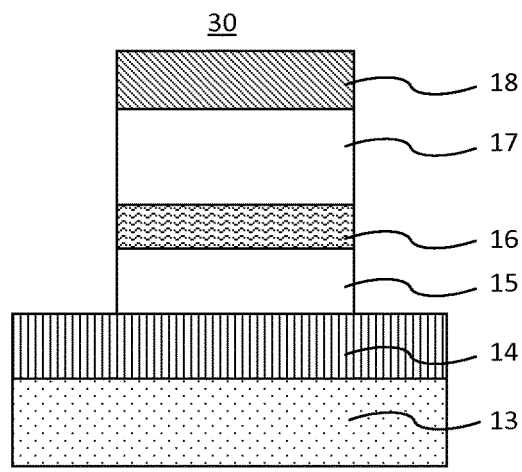
FIG. 4 is a cross-sectional view illustrating a manufacturing method according to the embodiment.

First, a mask (not shown) made of a photoresist is formed on the hard mask layer 18. Using the mask, patterning is performed on the hard mask layer 18 and down to bottom of the recording layer 14 or top surface of the SHE metal layer by ion beam etching (IBE) etching by using end-point detection scheme, as shown in FIG. 4.

Since possible re-deposition of metal atoms on the MTJ side wall could be formed, it's preferred to conduct a sputter etching at varied angle to remove these materials from tunnel barrier layer edges. It should be noted that any residual material from the recording layer may be further oxidized to avoid possible current crowding induced MTJ resistance variation. An optional process includes O ion or N ion implantation into the etched surface.

Figure 5:
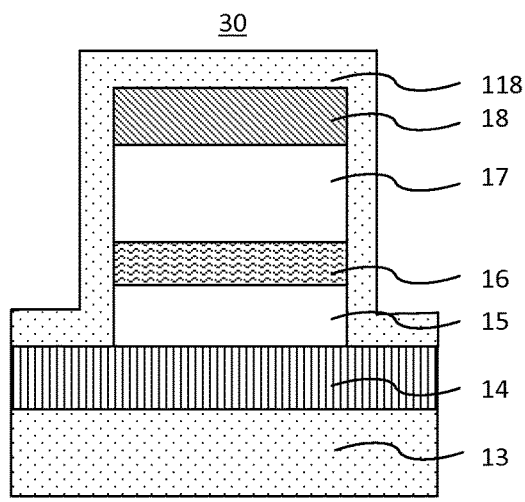
FIG. 5 is a cross-sectional view illustrating a manufacturing method according to the embodiment.

As shown in FIG. 5, a conformal insulating film 118 is then formed by a deposition technique, such as atomic layer deposition (ALD) with a uniform thickness to cover the surface of the patterned film consisting of the recording layer 15, tunnel barrier layer 16, the reference layer 17, and the hard mask layer 18.

Figure 6:
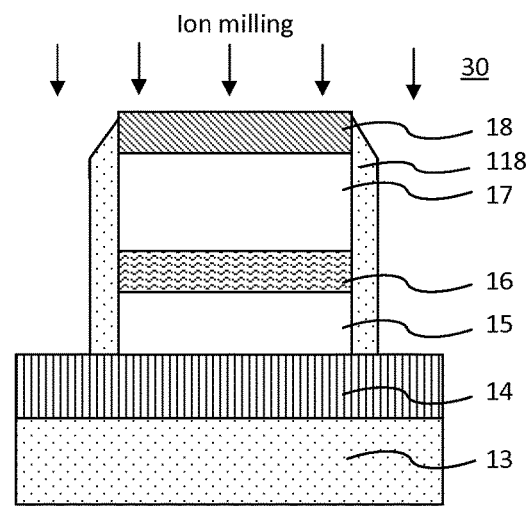
FIG. 6 is a cross-sectional view illustrating a manufacturing method according to the embodiment.

Further a perpendicular ion milling process having ion beam normal to the substrate surface and having an end-point detection scheme is conducted to etch down to the top surface of the SHE metal layer, as shown in FIG. 6.

Figure 7:
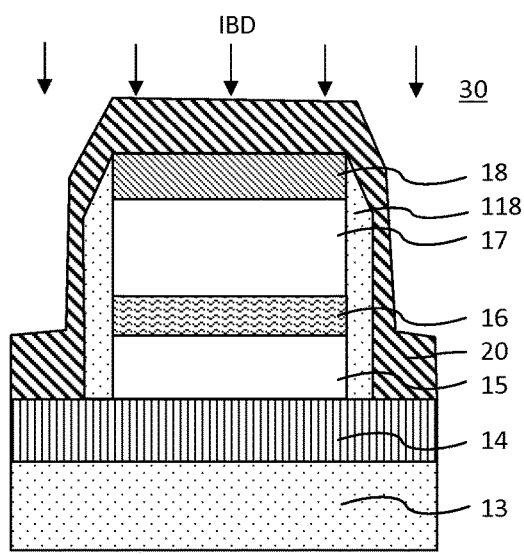
FIG. 7 is a cross-sectional view illustrating a manufacturing method according to the embodiment.
Figure 8:
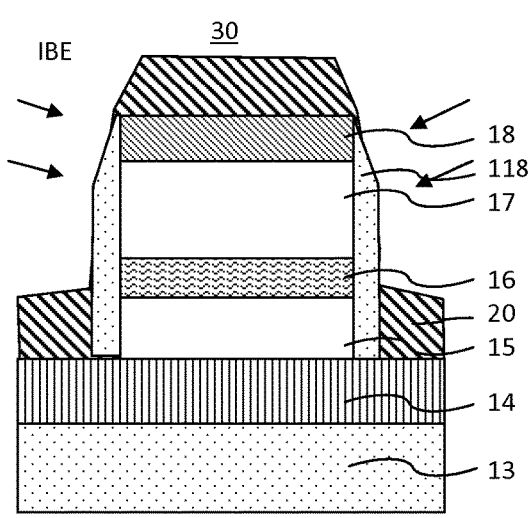
FIG. 8 is a cross-sectional view illustrating a manufacturing method according to the embodiment.

A nonmagnetic metal layer is then deposited by an ion beam depositing (IBD) process having a deposition direction which is normal to the substrate surface, as shown in FIG. 7, to form a non-uniform metal covering layer: side wall thickness is much thinner than the thickness at flat region. A rotating IBE process having a large angle is then conducted to mill away the side wall metal layer, as shown in FIG. 8, and leaving a metal layer at flat region as bottom electrodes connected to select transistors through VIAs. A further oxidization to avoid possible current crowding induced MTJ resistance variation can be added as an optional process including O ion or N ion implantation into the etched surface.

Figure 9:
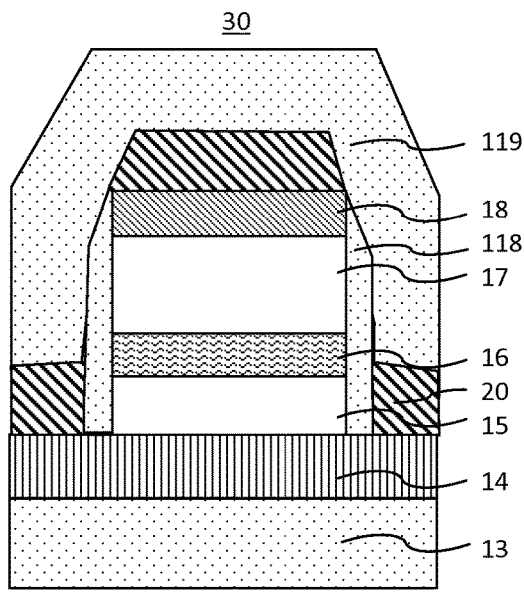
FIG. 9 is a cross-sectional view illustrating a manufacturing method according to the embodiment.
Figure 10:
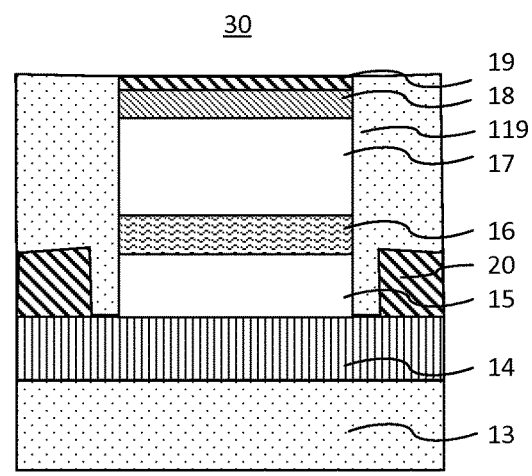
FIG. 10 is a cross-sectional view illustrating a manufacturing method according to the embodiment.

After that, an interlayer insulating film 119 is deposited to cover the entire surface, as shown in FIG. 9. The top surface is then flattened by conducting a CMP process to expose a surface of the top surface of the MTJ film, as shown in FIG. 10.

Figure 11:
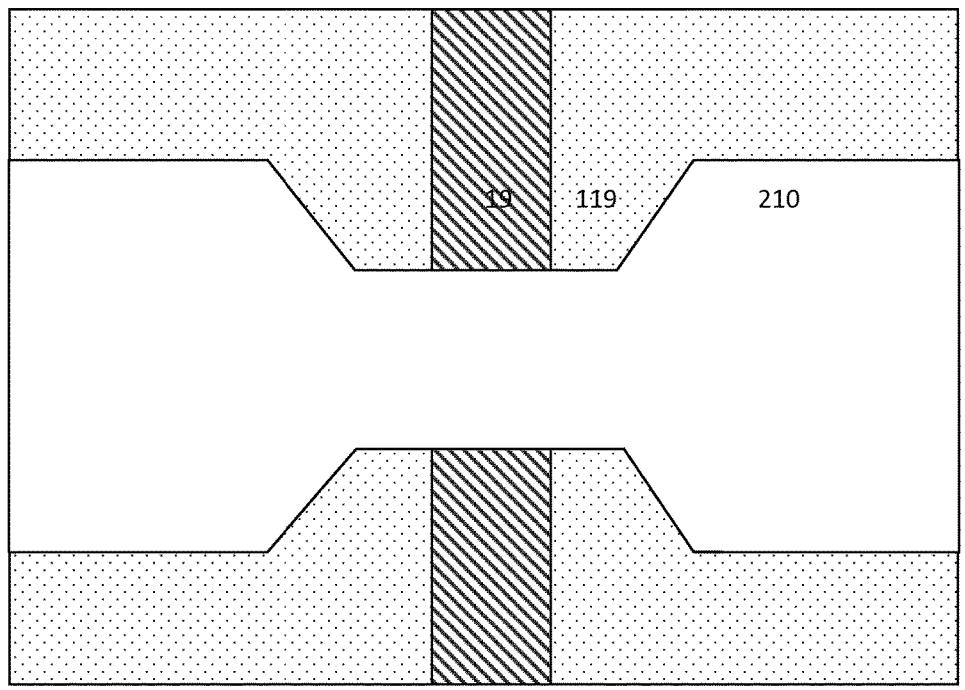
FIG. 11 is a cross-sectional view illustrating a manufacturing method according to the embodiment.
Figure 12:
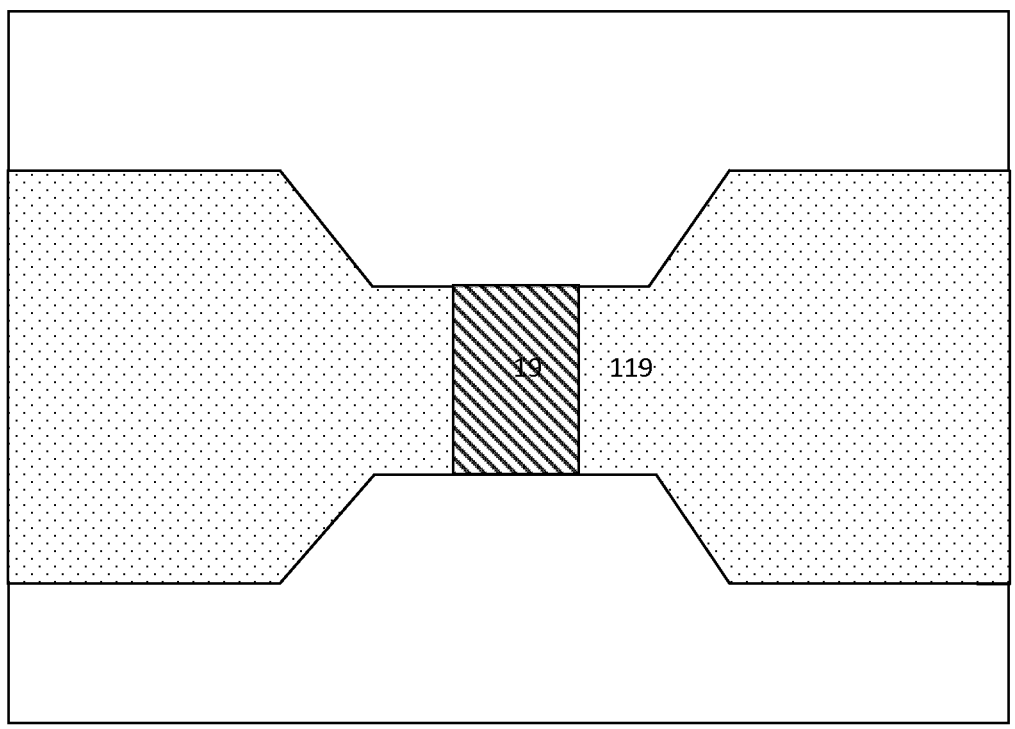
FIG. 12 is a cross-sectional view illustrating a manufacturing method according to the embodiment.

Then, a second mask 120 made of a photoresist is formed on the CMP flatten surface along a perpendicular direction to the orientation of the first mask. The top view of the second mask is shown in FIG. 11. Using the mask, patterning is performed and down to bottom of the SHE metal layer 14 by IBE etching. Both the width of the SHE metal layer and the length of the MTJ stack are shown as a top view in FIG. 12.

Finally, a bit line to be electrically connected to the MTJ stack is formed on the magnetoresistive element 30. The bit line may be made of aluminum (Al) or copper (Cu), for example. Thus, a memory cell of the MRAM is formed by the manufacturing method according to this embodiment.

While certain embodiments have been described above, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A method of manufacturing a magnetoresistive memory element comprising:
    forming of a first select transistor and a second select transistor and having both a first VIA of the first select transistor and a second VIA of the second select transistor exposed on a dielectric substrate surface;
    a deposition process of a Spin Hall Effect (SHE) metal layer on the dielectric substrate surface connecting to both the first VIA and the second VIA;
    a deposition process of a magnetic tunnel junction (MTJ) stack on top of the SHE metal layer; and
    a self-aligned patterning process to pattern the SHE metal layer into a SHE stripe having a first middle region on the dielectric substrate, a first end region connecting the first VIA and a second end region connecting the second VIA, and to pattern the MTJ stack into a MTJ stack pillow on top of the first middle region of the SHE stripe, and to form a first bottom electrode overlaid the first end region of the SHE stripe and a second bottom electrode overlaid the second end region of the SHE stripe;
    forming of a bit line on top of the MTJ stack pillow.

2. The method of claim 1, said MTJ stack comprising a recording layer, a tunnel barrier layer, a reference layer, and a cap layer, from bottom to top.

3. The method of claim 1, wherein said self-aligned patterning process comprising:
    a first lithographic patterning process to etch down to the bottom of the MTJ stack and form an MTJ stack stripe having a designed width along a first direction;
    a deposition process of a conformal film of a first insulating material to cover entire patterned surface;
    a first ion milling process normal to the substrate surface to etch away the first insulating material on top surface of the cap layer to form a self-aligned mask comprising a remaining top cap layer and sidewall insulating material;
    a second ion milling process normal to the substrate surface having an end-point detection technique to etch down to top surface of the SHE metal layer;
    a deposition process of a nonmagnetic metal layer by an ion beam depositing (IBD) process having a deposition normal to the substrate surface;
    a rotating ion beam etching (IBE) process having a large angle to mill away the nonmagnetic metal layer on side walls;
    a deposition process of a first interlayer insulating film, and a chemical mechanical polishing (CMP) to flatten upper face of the first interlayer insulating film;
    a second lithographic patterning process to etch down to said dielectric substrate surface underneath said SHE metal layer and to form an magnetic tunnel junction (MTJ) stack pillow having a designed length normal to the first direction, followed by an O ion or N ion implantation onto the etched surface upon necessity;
    a deposition process of a second interlayer insulating film, and a chemical mechanical polishing (CMP) to flatten upper face of the second interlayer insulating film.

4. The method of claim 3, further comprising a process including O ion or N ion implantation into the etched surface before said deposition of said conformal film of said first insulating material.

5. The method of claim 1, said SHE metal layer is made of by a high-Z metal selected from the group of Pt, beta-phase Ta, beta-phase W, doped Cu, having a thickness in a range between 1.5 nm and 6 nm.

* * * * *